United States Patent [19]

Shimada et al.

[11] Patent Number: 4,694,274

[45] Date of Patent: Sep. 15, 1987

[54] DATA COMPARISON CIRCUIT CONSTRUCTED WITH SMALLER NUMBER OF TRANSISTORS

[75] Inventors: Jiroh Shimada; Hiroshi Morito, both of Tokyo, Japan

[73] Assignee: NEC Corporation, Tokyo, Japan

[21] Appl. No.: 685,149

[22] Filed: Dec. 21, 1984

[30] Foreign Application Priority Data

Dec. 23, 1983 [JP]   Japan ................................ 58-243319

[51] Int. Cl.[4] ............................ G05B 1/00; G06F 7/04
[52] U.S. Cl. .................................................. 340/146.2
[58] Field of Search .............................. 307/450–453, 307/445, 585, 279, 355; 340/146.2

[56] References Cited

U.S. PATENT DOCUMENTS

| | | | |
|---|---|---|---|
| 3,517,175 | 6/1970 | Williams | 340/146.2 |
| 3,604,944 | 9/1971 | Gundersen | 307/355 |
| 4,109,141 | 8/1978 | Sasaki | 340/146.2 |

FOREIGN PATENT DOCUMENTS

0105140   6/1984   Japan ................................. 340/146.2

*Primary Examiner*—Stanley D. Miller
*Assistant Examiner*—Trong Q. Phan
*Attorney, Agent, or Firm*—Burns, Doane, Swecker & Mathis

[57] ABSTRACT

A circuit for comparing first and second binary coded digital data signals has a plurality of first circuits each including first and second transistors of a P-channel type connected in series between a first potential terminal and a first output node, a plurality of second circuits each including third and fourth transistors of an N-channel type connected in series between a second potential terminal and a second output node, and means for precharging the first and second output nodes to first and second logic levels, respectively. The first and third transistors are supplied with one bit data of the first signal, and the second and fourth transistors are supplied with an inverted data of the second signal. A change in the logic level at least one of the first and second output nodes is detected.

9 Claims, 6 Drawing Figures

DATA COMPARISON CIRCUIT CONSTRUCTED WITH SMALLER NUMBER OF TRANSISTORS

BACKGROUND OF THE INVENTION

The present invention relates to a data comparison circuit comparing two binary coded digital signals, and more particularly to a circuit detecting whether or not two binary coded digital signals are coincident with each other.

In a digital circuit, a data comparison circuit is often employed to detect the coincidence between first and second binary coded digital signals. Since both of the signals to be compared have binary coded data, the detection of the coincidence is achieved by comparing all corresponding bits.

For this purpose, the comparison circuit in the prior art includes a plurality of exclusive-OR (called hereinafter as an "EX-OR") circuits receiving the comparing bit data and one logic circuit such as an NOR circuit, for example. The NOR circuit has a plurality of input terminals supplied with the outputs of the respective EX-OR circuits. When the logic level of each bit data of the first binary coded digital signal is equal to the corresponding bit data of the second binary coded digital signal, each of the EX-OR circuits takes the output of a low level. The NOR circuit thereby produces an output signal of a high level. On the other hand, if at least one of the bit data of the first signal is different in level from the corresponding bit data of the second signal, at least one EX-OR circuit produces the output of the high level. As a result, the output signal of the NOR circuit takes the low level. As well-known in the art, one EX-OR circuit constituted by the so-called complementary MOS transistors includes five P-channel transistors and five N-channel transistors. Assuming that each of the first and second digital signals has ten bits, ten EX-OR circuits are necessary, resulting in that one hundred transistors are required. In addition, the NOR circuit has ten input terminals, and requires ten P-channel transistors and ten N-channel transistors. As a result, the data comparison circuit in the prior art requires one hundred and twenty transistors in total. This means that considerably power is consumed in the comparison circuit and that the area occupied by the comparison circuit is large on a semiconductor integrated circuit chip.

Moreover, a wiring pattern for interconnecting the respective transistors is very complicated. Stray capacitances is thus large. As a result, the operation speed of the circuit is low.

SUMMARY OF THE INVENTION

It is, therefore, an object of the present invention to provide a data comparison circuit constructed with a smaller number of transistors.

Another object of the present invention is to provide a data comparison circuit whose operation speed is fast and whose power consumption is small.

A data comparison circuit according to the present invention comprises a plurality of first series circuits each connected between a first potential terminal and a first output node and each including first and second transistors of a first conductivity type connected in series, a plurality of second series circuits each connected between a second potential terminal and a second output node and each including third and fourth transistors of a second conductivity type connected in series, means for supplying each bit data of a first digital signal to the first transistor in the second series circuit and to the third transistor in the second series circuit, respectively, means for supplying each bit data of a second digital signal to the second transistor in the first series circuit and to the fourth transistor in the second series circuit, respectively, means for initially charging the first output node to a first logic level, means for initially charging the second output node to a second logic level, and means for detecting a change in logic level at least one of the first and second output nodes.

When any one bit data of the first digital signal is equal in a logic level to the corresponding bit data of the second digital signal, the first and second transistors of the corresponding first series citcuit and/or the third and fourth transistors of the corresponding second series circuit are made conductive to change the logic level at the first output node and/or the second output node. The detecting means directs this change in the level at the output node(s) and produces an output signal. When all bit data of the first digital signal are not equal in logic level to the corresponding bit data of the second digital signal, none of the first and second transistors of all the first series circuits and none of the third and fourth transistors of all the second series circuit are made conductive. Accordingly, both of the logic levels at the first and second output nodes do not change. Thus, no change at the output nodes is detected only when all the bit data of the first signal are different from all the corresponding bit data of the second signal, respectively. This means that the circuit according to the present invention is usable as a detection circuit for detecting the coincidence between the respective bit data of the first and second digital signals, by inverting all bits of the first or second signal before comparison. In this case, no change at the output nodes is detected only when all the bits of the first and second signals are equal to each other.

The detecting means may be constituted of one NOR circuit having two input terminals and one inverter circuit. The first output node is connected to one of the input terminals of the NOR circuit, and the second output end is connected through the inverter to the other of the input terminals of the NOR circuit. As well-known in the art, the NOR circuit having two input terminals needs two transistors of the first conductivity type and two transistors of the second conductivity type, and the inverter circuit uses two transistors of the different conductivity type. Each of two charging means can be constituted by one transistor. Accordingly, the circuit according to the present invention can be constructed by forty-eight transistors if each of the first and second digital signals has ten bit data. In the case where the circuit according to the present invention is applied to the data coincidence detection circuit, ten inverter circuits are further necessary to invert one of two digital signals to be compared, and hence sixty-eight transistors are required. The number of transistors in the circuit according to the present invention is about half of that in the prior art circuit.

Since the transistors are small in number, the wiring pattern is simplified and the stray capacitances are reduced. Therefore, the circuit according to the present invention compares two digital signals at a high speed and with a small power consumption.

BRIEF DESCRIPTION OF THE DRAWINGS

The above and other objects, features and advantages of the present invention will be more apparent from the following description taken in conjunction with the accompanying drawings, in which.

DETAILED DESCRIPTION OF THE PRIOR ART

Figure 1:
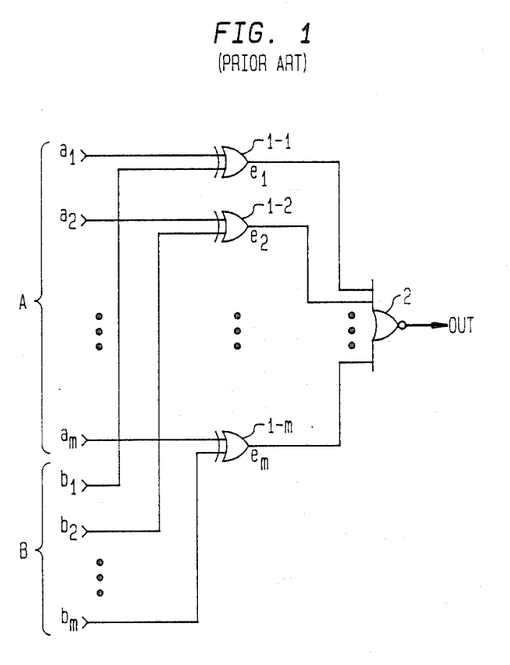
FIG. 1 is a logic circuit diagram of a digital data comparison circuit according to the prior art.
Figure 2A:
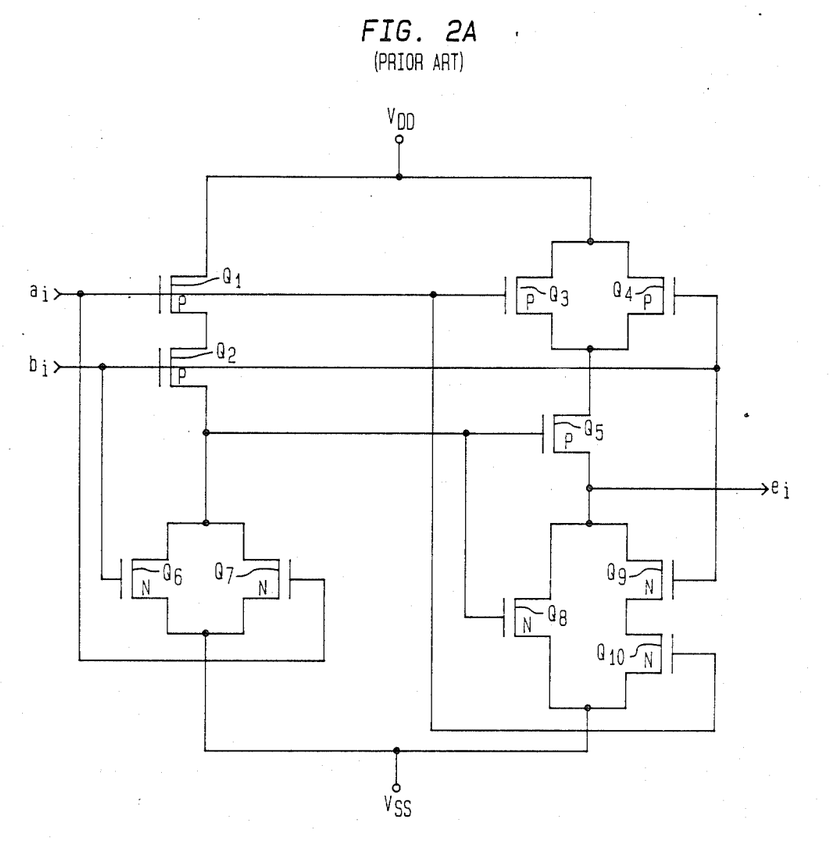
FIG. 2A is a circuit diagram of an exclusive OR (EX-OR) circuit used in the circuit shown in FIG. 1.
Figure 2B:
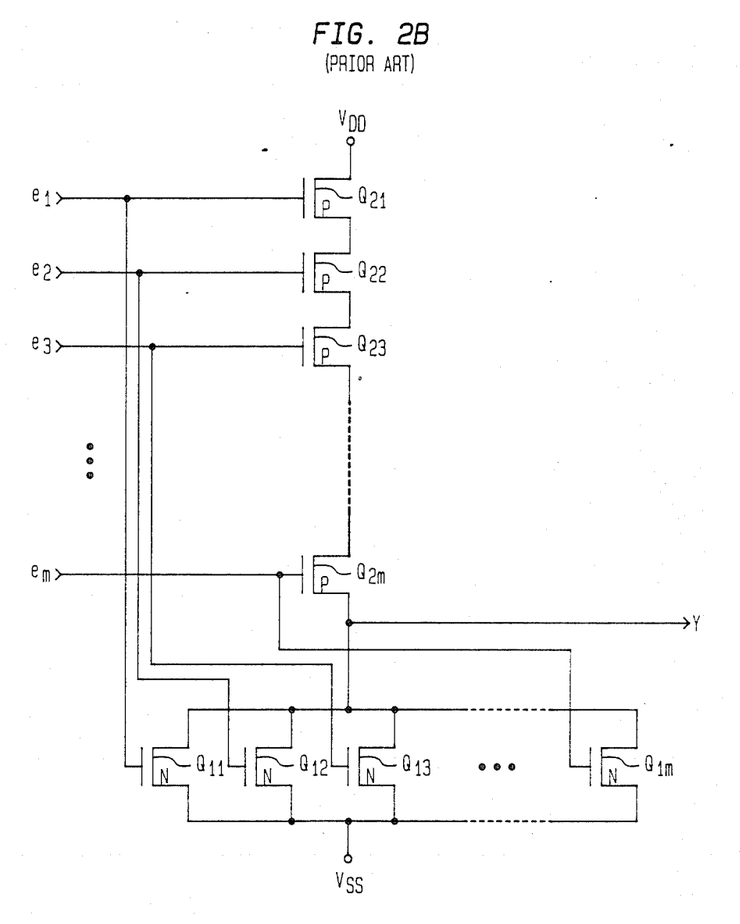
FIG. 2B is a circuit diagram of an NOR circuit shown in FIG. 1.

Referring now to FIGS. 1 and 2, a digital data comparison circuit according to the prior art will be described in order to facilitate the understanding of the features and advantages of the present invention.

The circuit shown in FIG. 1 compares two digital data signals A and B which consist of m bit data, i.e., ($a_1$, $a_2$, $a_3$, ..., $a_m$) and ($b_1$, $b_2$, $b_3$, ..., $b_m$), respectively. The first and m-th bit data $a_1$ and $a_m$ correspond to the least and most significant bits of the signal A, respectively, and the first and m-th bit data $b_1$ and $b_m$ correspond to the least and most significant bits of the signal B, respectively. In order to compare the two digital data signals A and B, this circuit includes m pieces of EX-OR circuits 1-1 to 1-m each having two input terminals and one NOR circuit 2 having m pieces of input terminals. The m parts of bit data ($a_1$, $b_1$), ($a_2$, $b_2$), ($a_3$, $b_3$), ..., ($a_m$, $b_m$) are supplied to the EX-OR circuits 1-1 to 1-m, respectively. The outputs $e_1$, $e_2$, $e_3$, ..., $e_m$ of the EX-OR circuits 1-1 to 1-m are supplied to the input terminals of the NOR circuits 2, respectively.

When the respective pairs of bit data ($a_1$, $b_1$) to ($a_m$, $b_m$) are equal in logic level with each other, all the outputs $e_1$ to $e_m$ take a low level. As a result, the NOR circuit produces an output signals Y of a high level. If any one of m pairs of bit data ($a_1$, $b_1$) to ($a_m$, $b_m$) are unequal in the logic level, at least one of the EX-OR circuits 1-1 to 1-m produces an output of the high level changing the output Y or the NOR circuit 2 to the low level.

This prior art circuit thus compares two digital data signals A and B, but requires m pieces of EX-OR circuits 1-1 to 1-m and one NOR circuit 2 having m pieces of input terminals.

As is well-known in the art and shown in FIGS. 2A and 2B, in a complementary logic circuit technique, one EX-OR circuit is constituted by five P-channel insulated gate transistors $Q_1$ to $Q_5$ and five N-channel insulated gate transistors $Q_6$ to $Q_{10}$, and the NOR circuit having m pieces of input terminals is constituted by m pieces of N-channel insulated gate transistors $Q_{11}$ to $Q_{1m}$ and m pieces of P-channel insulated gate transistors $Q_{21}$ to $Q_{2m}$. As a result, the circuit shown in FIG. 1 requires ($10 \times m + 2 \times m$) transistors. Assuming that each of the digital signals A and B has 10 bit data, the circuit explained above requires at least 120 transistors. In the case where the circuit shown in FIG. 1 is formed as an integrated circuit device, the chip area occupied by the circuit is remarkably large. Moreover, the internal wiring pattern is complicated due to the interconnection of a great number of transistors, and the stray capacitances are also made large thereby lowing the operation speed. Particularly, the input gate capacitance of the NOR circuit 2 is considerably large since the NOR circuit 2 has a plurality of input terminals. For this reason, the operation speed at the NOR circuit 2 is very slow. These disadvantages become more serious as the number of the bits is increased.

DETAILED DESCRIPTION OF THE PREFERRED EMBODIMENT

Figure 3:
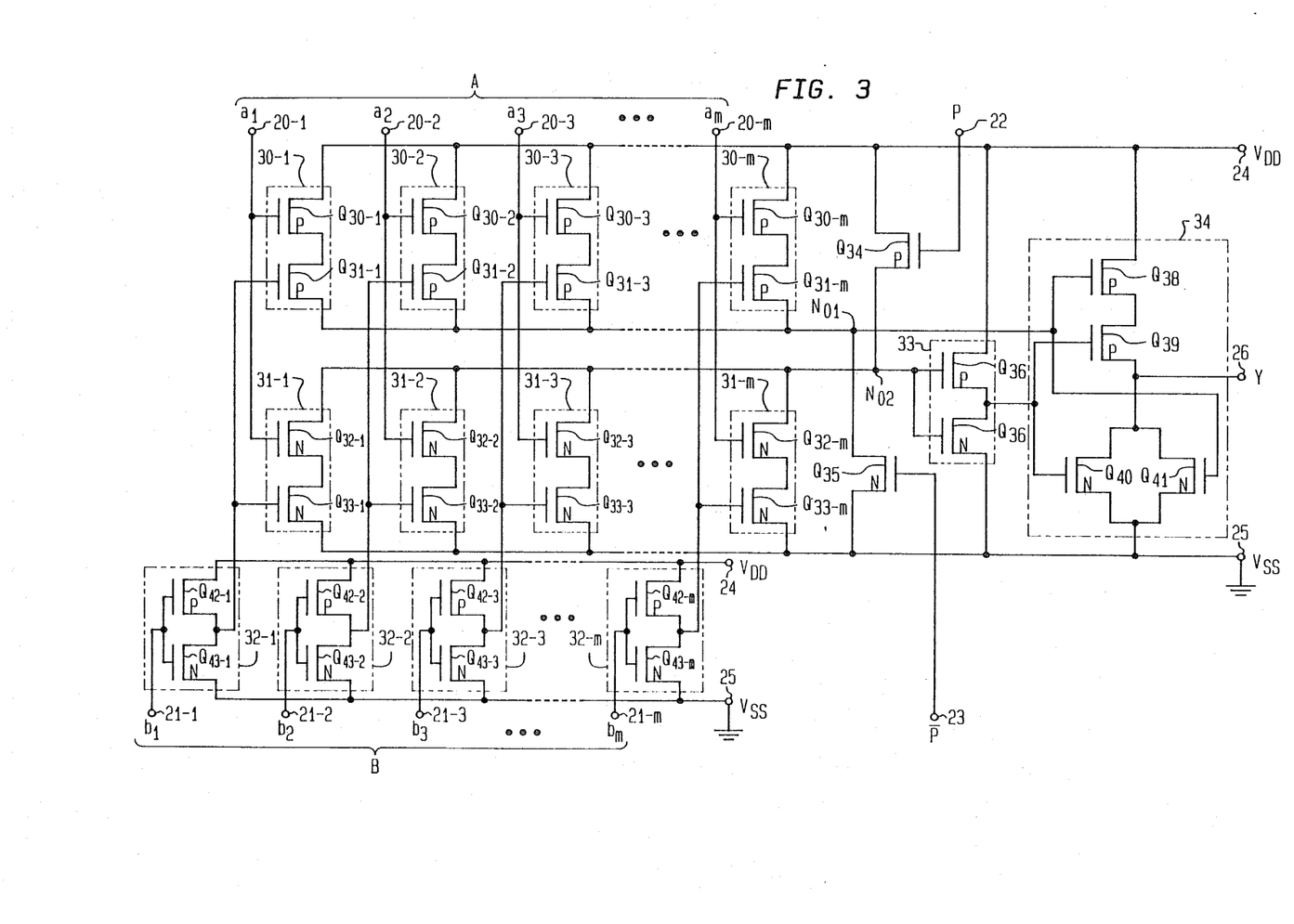
FIG. 3 is a circuit diagram of a digital data comparison circuit according to a preferred embodiment of the present invention.

Referring to FIG. 3, there is shown a digital data comparison circuit according to an embodiment of the present invention. This circuit is formed as an integrated circuit device and constituted by complementary insulated gate field effect transistors including a first channel type or a first conductivity type (P-channel type, for example) MOS (Metal-Oxide-Semiconductor) transistors and a second channel type or a second conductivity type (N-channel type) MOS transistors.

A first digital signal A consisting of m-bit data $a_1$, $a_2$, $a_3$, ... and $a_m$ is supplied to a set of first input terminals 20-1, 20-2, 20-3, ... and 20-m, and a second digital signal B consisting of m-bit data $b_1$, $b_2$, $b_3$, ... and $b_m$ is supplied to another set of second input terminals 21-1, 21-2, 21-3, ... and 21-m. The first and m-th bit data $a_1$ and $a_m$ correspond to the least and most significant bits of the signal A, respectively, and bit data $b_1$ and $b_m$ correspond to the least and most significant bits of the signal B. All the bit data $b_1$ to $b_m$ are inverted by inverter circuits 32-1 to 32-m, respectively, each of which includes a P-channel MOS transistor $Q_{42-1}$, $Q_{42-2}$, $Q_{42-3}$, ... or $Q_{42-m}$ and an N-channel MOS transistor $Q_{43-1}$, $Q_{43-2}$, $Q_{43-3}$, ... or $Q_{43-m}$ connected in series between first and second power potential terminals 24 and 25. The first potential terminal 24 is applied with a first power potential $V_{DD}$ (a positive potential in the embodiment), and a second power potential $V_{SS}$ (a ground potential in the embodiment) is applied to the terminal 25.

M pieces of first series circuits 30-1, 30-2, 30-3, ... and 30-m are provided, each of which includes two P-channel MOS transistors $Q_{30-1}$ and $Q_{31-1}$, $Q_{30-2}$ and $Q_{31-2}$, ... or $Q_{30-m}$ and $Q_{31-m}$ connected between the first potential terminal 24 and a first output node $N_{01}$. Further, m pieces of second series circuits 31-1, 31-2, 31-3, ... and 31-m are connected in parallel between the second potential terminal 25 and a second output node $N_{02}$, each of which includes two N-channel MOS transistors $Q_{32-1}$ and $Q_{33-1}$, $Q_{32-2}$ and $Q_{33-2}$, ... or $Q_{32-m}$ and $Q_{33-m}$. The gates of the transistors $Q_{30-1}$ to $Q_{30-m}$ are connected to those of the transistors $Q_{32-1}$ to $Q_{32-m}$, respectively, and further connected to first input terminals 20-1 to 20-m, respectively. The outputs of the inverter circuits 32-1 to 32-m are connected to the gates of the transistors $Q_{31-1}$ to $Q_{31-m}$, respectively, and further connected to those of the transistors $Q_{33-1}$ to $Q_{33-m}$, respectively.

A P-channel MOS transistor $Q_{34}$ is connected between the first potential terminal 24 and the second output node $N_{02}$, and an N-channel MOS transistor $Q_{35}$ is connected between the second potential terminal 25 and the first output node $N_{01}$. The gates of the transistors $Q_{34}$ and $Q_{35}$ are connected to first and second precharge terminals 22 and 23, respectively, which are in turn supplied with first and second precharge signals P and $\overline{P}$, respectively. The first output node $N_{01}$ is connected to the first input terminal of an NOR circuit 34 whose second input terminal is connected to the second output node $N_{02}$ through an inverter circuit 33. The NOR circuit 34 includes two P-channel MOS transistors $Q_{38}$ and $Q_{39}$ connected in series between the first potential terminal 24 and an output terminal 26 and two N-channel transistors $Q_{40}$ and $Q_{41}$ connected in parallel between the output terminal 26 and the second potential terminal 25. A detection output signal Y is derived from the output terminal 26. The inverter 33 includes a P-channel MOS transistor $Q_{36}$ and an N-channel MOS transistor $Q_{37}$ connected in series between the first and second power potential terminals 24 and 25.

The circuit operation of the comparison circuit shown in FIG. 3 will be described with reference to FIG. 4.

For the purpose of presetting initial logic levels at the respective circuit nodes, a controller (not shown) clamps all the input terminals 20-1 to 20-m and 21-1 to 21-m to a low level. The inverters 32-1 to 32-m thereby produce a high level at their outputs, respectively. Accordingly, the transistors $Q_{30-1}$ to $Q_{30-m}$ and $Q_{33-1}$ to $Q_{33-m}$ are turned ON, but the transistors $Q_{31-1}$ to $Q_{31-m}$ and $Q_{32-1}$ to $Q_{32-m}$ are turned OFF. At this time, the controller further supplies the low level and the high level to the precharge terminals P and $\overline{P}$, respectively. The transistors $Q_{34}$ and $Q_{35}$ are thereby turned ON to charge the output nodes $N_{02}$ and $N_{01}$ to the high level and the low level, respectively. This causes the transistors $Q_{37}$ to $Q_{39}$ to turn ON. As a result, the output signal Y takes the high level.

In order to compare the binary coded digital signals A and B, the precharge terminals P and $\overline{P}$ are changed to the high level and the low level to turn the transistors $Q_{34}$ and $Q_{35}$ OFF, respectively. Simultaneously with this, the digital signals A and B are supplied to the first and second sets of input terminals (20-1 to 20-m) and (21-1 to 21-m), respectively. If desired, the signals A and B may be supplied after the precharge terminals P and $\overline{P}$ are changed to the high level and the low level.

Figure 4:
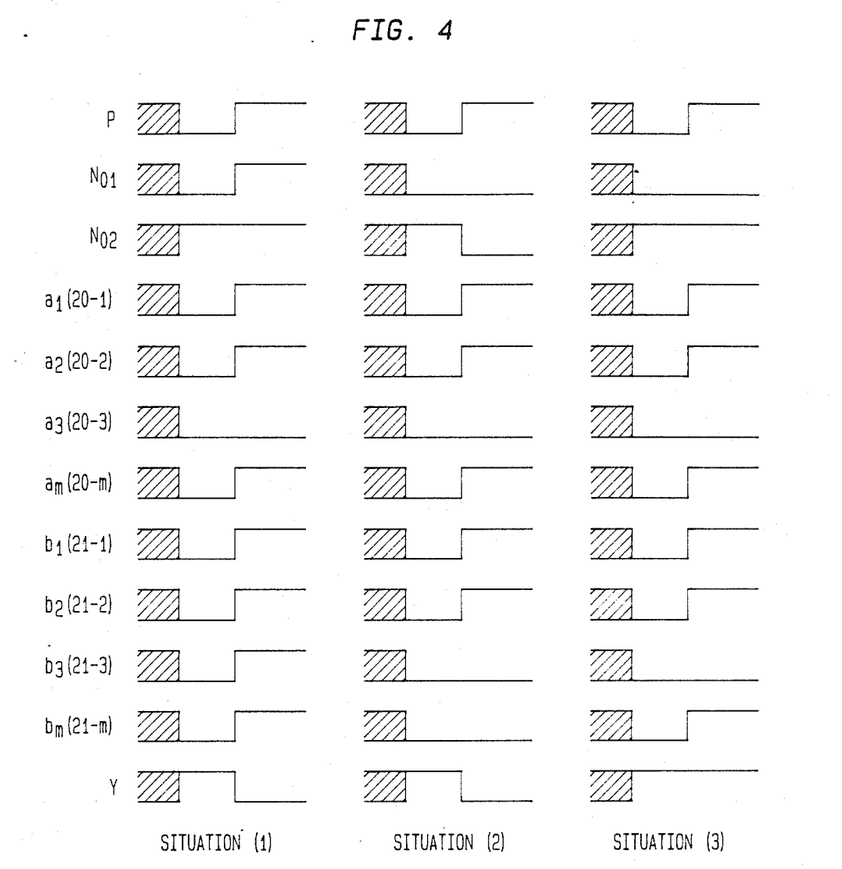
FIG. 4 is a voltage waveform diagram at the respective nodes of the circuit shown in FIG. 3.

As shown in the situation (1) in FIG. 4, the first digital signal A is supplied in which only the third bit data $a_3$ is "0" (i.e., the low level) and the remaining bit data are "1" (the high level). The P-channel transistor $Q_{30-3}$ and the N-channel transistors $Q_{32-1}$ to $Q_{32-m}$ are thereby turned ON. All the bit data $b_1$ to $b_m$ of the second digital signal B are "1". The outputs of the inverters 32-1 to 32-m are thereby changed to the low level to turn the transistors $Q_{31-1}$ to $Q_{31-m}$ ON. In other words, both of the transistors $Q_{30-3}$ and $Q_{31-3}$ connected in series between the terminal 24 and the output node $N_{01}$ are turned ON in response to the signals A and B shown in the situation (1) in FIG. 4. As a result, the output node $N_{01}$ is charged to the high level. This causes the transistors $Q_{38}$ and $Q_{41}$ to turn OFF and ON, respectively. The output signal Y is thus changed to the low level.

If both of the third bit data $a_3$ and $b_3$ of the signals A and B are "0" as shown in the situation (2) in FIG. 4, the inverter 32-3 does not turn the transistor $Q_{31-3}$ ON, and $Q_{31-3}$ is maintained in the OFF-state. The signal B has the m-th bit data $b_m$ of "0", however. Therefore, the transistor $Q_{33-m}$ is turned ON. The second output node $N_{02}$ is thus discharged to the low level. This causes the transistors $Q_{36}$ and $Q_{40}$ to turn ON and the transistor $Q_{39}$ to turn OFF. As a result, the output signal Y takes the low level.

Thus, when any one of the bit data of the first signal A is different in the logic level from the corresponding bit data of the second signal B, at least one pair of the P-channel transistors $Q_{30}$ and $Q_{31}$ and/or at least one pair of the N-channel transistors $Q_{32}$ and $Q_{33}$ are turned ON to change the logic levels at the output node $N_{01}$ and/or $N_{02}$. The output signal Y thus changes to the low level.

When only the third bit data $a_3$ and $b_3$ of the signals A and B are "0" as shown in the situation (3) in FIG. 4, the P-channel transistors $Q_{30-3}$, $Q_{31-1}$, $Q_{31-2}$, and $Q_{31-4}$ to $Q_{31-m}$ and the N-channel transistors $Q_{32-1}$, $Q_{32-2}$, $Q_{32-4}$ to $Q_{32-m}$, and $Q_{33-3}$ are turned ON, and the P-channel transistors $Q_{30-1}$, $Q_{30-2}$, $Q_{30-4}$ to $Q_{30-m}$, and $Q_{31-3}$ and the N-channel transistors $Q_{32-3}$, $Q_{33-1}$, $Q_{32-2}$, and $Q_{33-4}$ to $Q_{33-m}$ are turned OFF. Accordingly, the levels at the output nodes $N_{01}$ and $N_{02}$ are held to maintain the output signal Y at the high level. In other words, either one of series connected P-channel transistors $Q_{30}$ and $Q_{31}$ and either one of the series connected N-channel transistors $Q_{32}$ and $Q_{33}$ are maintained in the OFF-state when each bit data of the signal A is equal in logic level to the corresponding bit data of the signal B, and the output signal Y maintains the high level.

The gates of the transistor $Q_{34}$ and $Q_{35}$ may be connected to the terminals 25 and 24, respectively, to maintain them in the ON-state. In this case, the current capacity of the transistor $Q_{34}$ should be smaller than the series connected transistors $Q_{32}$ and $Q_{33}$ to change the level at the node $N_{02}$. Similarly, the current capacity of the transistor $Q_{35}$ should be smaller than the series connected transistors $Q_{30}$ and $Q_{31}$ to change the level at the node $N_{01}$.

Figure 5:
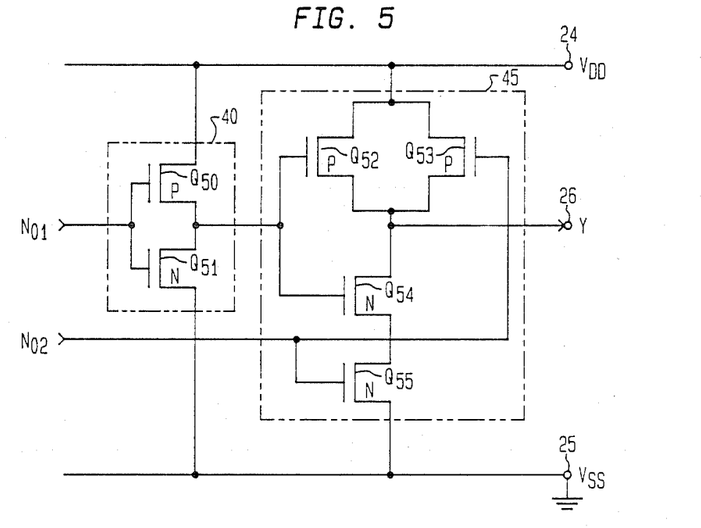
FIG. 5 is a circuit diagram of another output section according to the present invention.

FIG. 5 shows an output section according to another embodiment of the present invention, in which the first output node $N_{01}$ is connected through an inverter 40 to the first input end of an NAND circuit 45 and the second output node $N_{02}$ is connected to the second input end of the NAND circuit 45. The inverter 40 includes a P-channel MOS transistor $Q_{50}$ and an N-channel MOS transistor $Q_{51}$ connected in series between the power potential terminals 24 and 25. The NAND circuit includes two P-channel MOS transistors $Q_{52}$ and $Q_{53}$ connected in parallel between the terminal 24 and the output terminal 26 and two N-channel MOS transistors $Q_{54}$ and $Q_{55}$ connected in series between the output terminal 26 and the potential terminal 25.

In the initial condition, the levels at the nodes $N_{01}$ and $N_{02}$ are the low level and the high level, respectively, and therefore, the output signal Y takes the low level. When each bit data of the signal A is not equal in the logic level to the corresponding bit data of the signal B, at least one of the P-channel transistors $Q_{52}$ and $Q_{53}$ is turned ON and at least one of the N-channel transistors $Q_{54}$ and $Q_{55}$ is turned OFF. As a result, the output signal Y takes the high level. When the data of the respective bits of the signal A are equal in the logic level to those of the corresponding ones of the signal B, the output signal Y maintains the low level.

As described above in detail, the digital data comparison circuit according to the present invention detects the coincidence between the respective bit data of two signals A and B, and is constituted by a small number of transistors. The number of the transistors required is $(4 \times m + 2 \times m + 8)$ in total, where m is the number of bits of each of signals A and B. If m is 10, the number of transistors is 68 $(= 4 \times 10 + 2 \times 10 + 8)$. Since the circuit according to the present invention is constituted buy a smaller number of transistors than previously known, the wiring pattern on the semiconductor chip is simplified and the stray capacitance is made small, resulting in a high speed of operation. The small number of transistors consume a small quantity of power.

The present invention is not limited to the above embodiments, but may be modified and change without departing from the scope and spirit of the present invention.

What is claimed is:

1. A transistor circuit comprising first and second potential terminals, first and second output nodes, at least one first series circuit connected between said first potential terminal and said first output node and including first and second transistors connected in series, at least one second series circuit connected between said second potential terminal and said second output node and including third and fourth transistors connected in series, first means for supplying a first digital signal to control electrodes of said first and third transistors, second means for supplying a second digital signal to control electrodes of said second and fourth transistors, said first and third transistors being of different conductivity types from each other, said second and fourth transistors being of different conductivity types from each other, third means for precharging said first and second output nodes to different logic levels from each other, and fourth means for detecting a change in the level at at least one of said first and second output nodes.

2. The transistor circuit as claimed in claim 1, wherein said second means includes means for inverting said second digital signal and means for supplying to said second and fourth transistors the inverted signal of said second digital signal.

3. The transistor circuit as claimed in claim 1, wherein said third means includes a fifth transistor connected between said first potential terminal and said second output node and controlled by a precharge signal and a sixth transistor connected between said second potential terminal and said first output node and controlled by an inverted signal of said precharge signal.

4. A transistor circuit comprising a plurality of first series circuits each including first and second field effect transistors of a first conductivity type and each connected between a first potential terminal and a first output node, a plurality of second series circuits each including third and fourth field effect transistors of a second conductivity type and each connected between a second potential terminal and a second output node, each of said first series circuits receiving one bit data of a first binary coded digital signal at a gate of said first transistor and one bit data of a second binary coded digital signal at a gate of said second transistor, each of said second series circuits receiving one bit data of said first signal at a gate of said third transistor and one bit data of said second signal at a gate of said fourth transistor, a fifth field effect transistor connected between said first potential terminal and said second output node to precharge said second output node to a first logic level relative to a potential at said first potential terminal, a sixth field effect transistor connected between second potential terminal and said first output node to precharge said first output node to a second logic level relative to a potential at said second potential terminal, and a logic circuit having two input ends respectively connected to said first and second output node and producing an output signal.

5. The transistor circuit as claimed in claim 4, further comprising a plurality of inverter circuits each having its output end coupled to the gates of the associated second and fourth transistors.

6. A transistor circuit comprising a plurality of first input terminals supplied with each bit of data of a first digital signal, respectively, a plurality of second input terminals supplied with each bit of data of a second digital signal, respectively, a plurality of inverter circuits whose input ends are connected to said second input terminals, respectively, first and second potential terminals, first and second output ends, a plurality of first field effect transistors of a first channel type whose gates are connected to said first input terminals, respectively, a plurality of second field effect transistors of said first channel type whose gates are connected to output ends of said inverter circuits, respectively, each one of said field effects transistors being connected in series with each one of said second field effect transistors between said first potential terminal and said first output node, a plurality of third field effect transistors of a second channel type whose gates are connected to said first input terminals, respectively, a plurality of fourth field effect transistors of said second channel type whose gates are connected to the output ends of said inverter circuits respectively, each of said third field effect transistors being connected in series with each one of said fourth field effect transistors between said second potential terminal and said second output node, a first precharge terminal supplied with a precharge signal, a second precharge terminal supplied with an inverted signal of said precharge signal, a fifth field effect transistor of said first channel type connected between said first potential terminal and said second output node and having a gate connected to said first precharge terminal, a sixth field effect transistor of said second channel type connected between said second potential terminal and said first output node and having a gate connected to said second precharge terminal, and an output circuit detecting a change in logic level at said first and second output nodes and producing an output signal.

7. The transistor circuit as claimed in claim 6, wherein said output circuit includes an additional inverter circuit and an NOR circuit having two input ends and an output end connected to an output terminal, said first output node being connected to one input end of said NOR circuit, and said second output node being connected to the other input end of said NOR circuit through said additional inverter circuit.

8. The transistor circuit as claimed in claim 6, where said output circuit includes an additional inverter circuit and an NAND circuit having a first input end connected through said additional inverter circuit to said first output node, a second input end connected to said second output node, and an output end connected to an output terminal.

9. The transistor circuit as claimed in claim 6, wherein each of said inverter circuits includes a seventh field effect transistor of said first channel type and an eighth field effect transistor of said second channel type connected in series between said first and second potential terminals.

* * * * *